（12）United States Patent
Shimotori

(10) Patent No.: US 8,363,448 B2
(45) Date of Patent: Jan. 29, 2013

(54) SEMICONDUCTOR MEMORY DEVICE

(75) Inventor: Takafumi Shimotori, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 225 days.

(21) Appl. No.: 12/873,756

(22) Filed: Sep. 1, 2010

(65) Prior Publication Data
US 2011/0051498 A1    Mar. 3, 2011

(30) Foreign Application Priority Data

Sep. 1, 2009    (JP) .................................. 2009-201971

(51) Int. Cl.
*G11C 11/00*    (2006.01)
(52) U.S. Cl. .............. 365/148; 365/46; 365/55; 365/97; 365/131; 365/158; 365/171; 365/173; 365/163; 365/189.14; 365/189.15; 365/189.07; 365/189.09; 365/203; 365/204
(58) Field of Classification Search ..................... 365/46, 365/55, 74, 97, 10, 131, 148, 158, 171, 173, 365/163, 189.14, 189.15, 189.07, 189.09, 365/203, 204
See application file for complete search history.

(56) References Cited

U.S. PATENT DOCUMENTS

2008/0291716 A1    11/2008    Futatsuyama et al.
2009/0285009 A1*   11/2009    Kim et al. .................... 365/148

FOREIGN PATENT DOCUMENTS

JP    2008-287827    11/2008

* cited by examiner

*Primary Examiner* — Fernando Hidalgo
(74) *Attorney, Agent, or Firm* — Oblon, Spivak, McClelland, Maier & Neustadt, L.L.P.

(57) ABSTRACT

According to one embodiment, a semiconductor memory device includes a memory cell, a power supply circuit, an interconnection and a discharging circuit. The memory cell includes a variable resistance element whose resistance varies by application of a voltage. The power supply circuit outputs the voltage to be applied to the memory cell. The interconnection is formed between the power supply circuit and the memory cell and supplies the voltage output from the power supply circuit to the memory cell. The discharging circuit is connected to the interconnection. The discharging circuit discharges electric charge accumulated in the interconnection after a first operation of applying the voltage to the memory cell is ended and before a second operation of applying the voltage to the memory cell next is started.

14 Claims, 6 Drawing Sheets

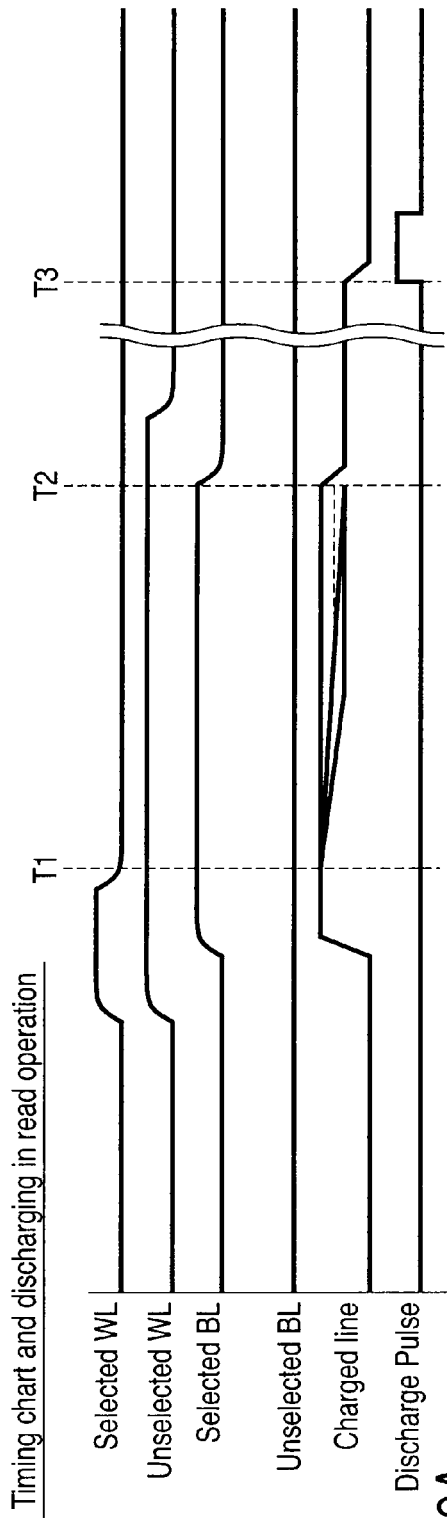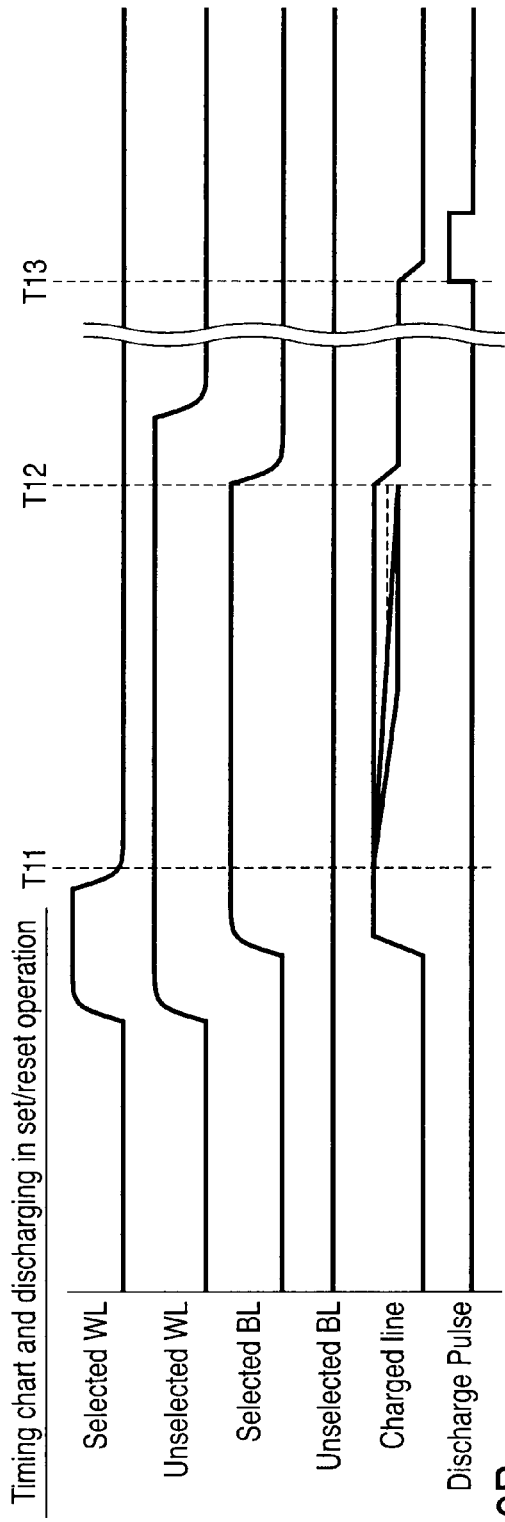
FIG. 9A
FIG. 9B

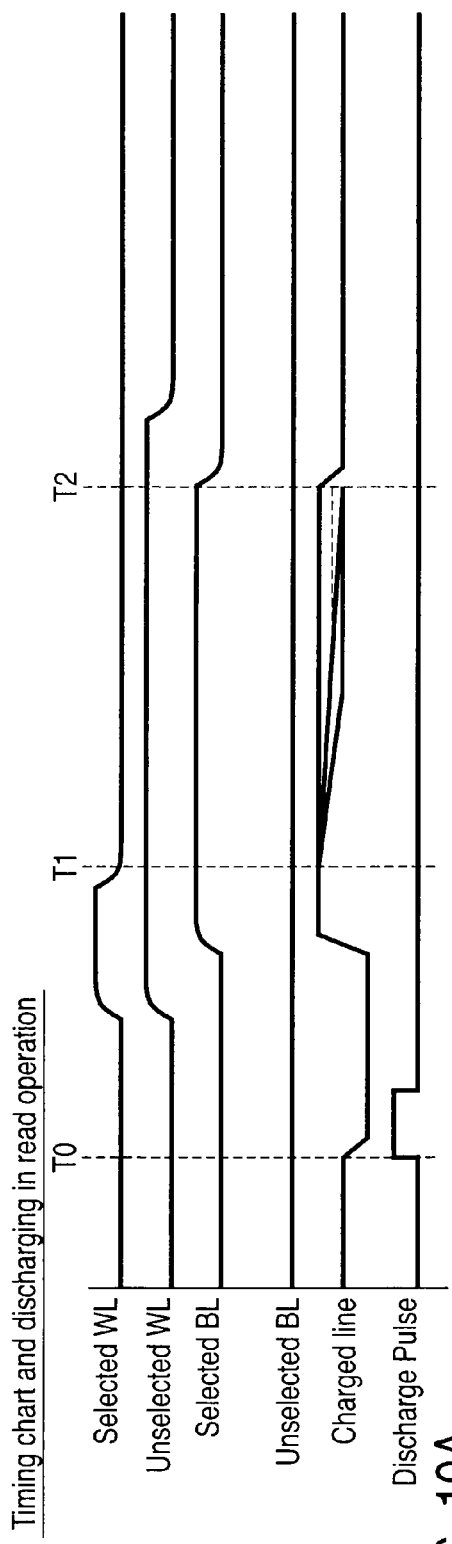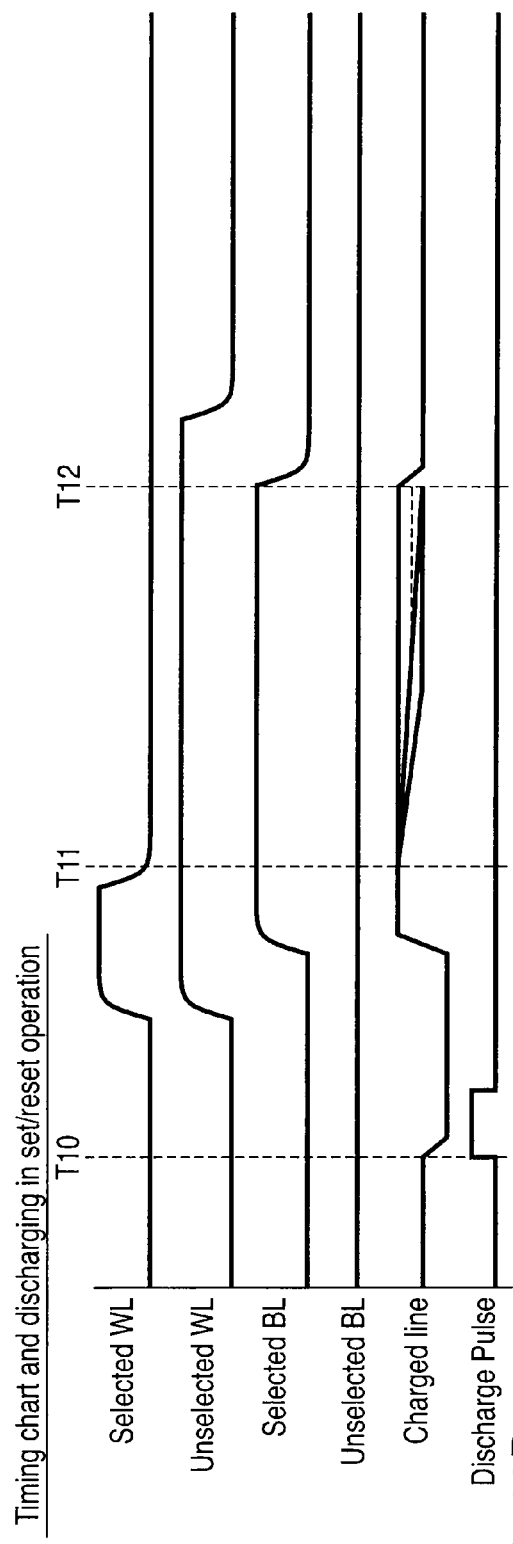

SEMICONDUCTOR MEMORY DEVICE

CROSS-REFERENCE TO RELATED APPLICATIONS

This application is based upon and claims the benefit of priority from Japanese Patent Application No. 2009-201971, filed Sep. 1, 2009; the entire contents of which are incorporated herein by reference.

FIELD

Embodiments described herein relate generally to a semiconductor memory device which applies a voltage to a memory cell to change a state of the memory cell, for example, a resistance change memory.

BACKGROUND

In recent years, as a successor candidate of a semiconductor memory device, a resistance change memory which uses, as a memory cell, a variable resistance element whose resistance varies based on a voltage to be applied, for example, a resistive random access memory (ReRAM) has been attracting attention (for example, see Jpn. Pat. Appln. KOKAI Publication No. 2008-287827).

In a resistance change memory, it has been found that a state of a memory cell changes depending on an application of a minute voltage. Since the memory cell cannot hold its previous state even though a minute voltage is applied, a serious problem on reliability is posed.

In this case, in the resistance change memory, after an operation such as a read operation or a state change operation, an interconnection connected to the memory cell may be unnecessarily electrically charged. In this case, unnecessary voltage stress acts on the memory cell when a power supply is turned on/off or a next operation is executed, and the state of the memory cell may be changed.

As a transistor which drives a normal voltage, a p-channel transistor may be used. However, in this case, the p-channel transistor is turned on in a power-off state, electric charge accumulated in the interconnection or the like is discharged, and voltage stress may disadvantageously act on the memory cell.

BRIEF DESCRIPTION OF THE DRAWINGS

FIGS. 9A and 9B are timing charts showing a discharging operation (first example) of the voltage supply circuit in the embodiment; and FIGS. 10A and 10B are timing charts showing a discharging operation (second example) of the voltage supply circuit in the embodiment.

DETAILED DESCRIPTION

Before the explanation of an embodiment, the background to a proposal of the embodiment will be described. In this case, as a semiconductor memory device, a resistive random access memory (ReRAM) having a variable resistance element is exemplified.

It is known that configurations of variable resistance elements for a resistive random access memory are of two types. One of the types is called a bipolar type which switches polarities of application voltages to set a high-resistance state and a low-resistance state. The other one is called a unipolar type which controls a voltage value and a voltage application time without switching polarities of application voltages to make it possible to set a high-resistance state and a low-resistance state.

In order to realize a high-density memory cell array, the unipolar type can be used. In a unipolar ReRAM, data is written in a memory cell by applying a predetermined voltage to a variable resistance element for a short period of time. In this manner, the variable resistance element is changed from a high-resistance state to a low-resistance state. The operation of changing the variable resistance element from a high-resistance state to a low-resistance state is called a set operation.

On the other hand, data erasing for a memory cell is performed by applying a predetermined voltage lower than that in the set operation to a variable resistance element set in a low-resistance state after the set operation for a long period of time. In this manner, the variable resistance element changes from a low-resistance state to a high-resistance state. The operation of changing the variable resistance element from the low-resistance state to the high-resistance state is called a reset operation.

Figure 1:
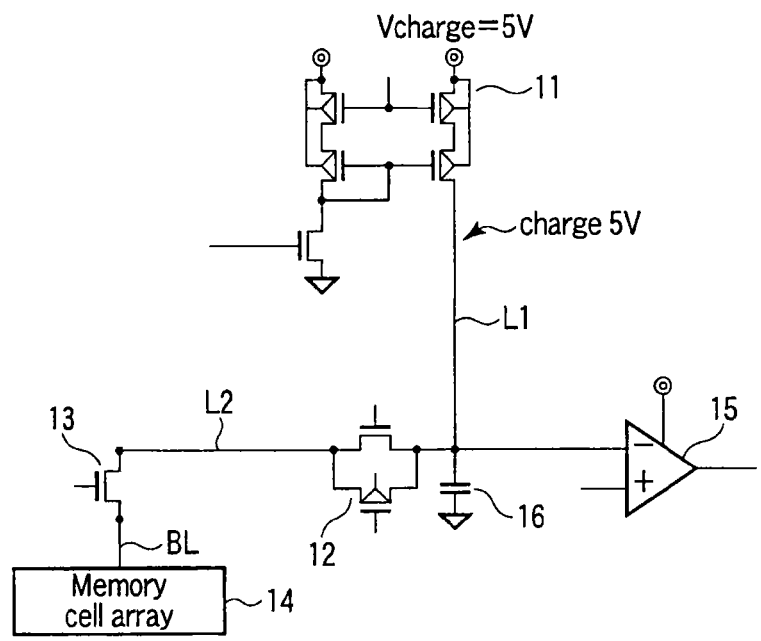
FIG. 1 is a circuit diagram showing a configuration of a voltage supply circuit which performs state conversion and a read operation for a memory cell in a resistance change memory.
Figure 2:
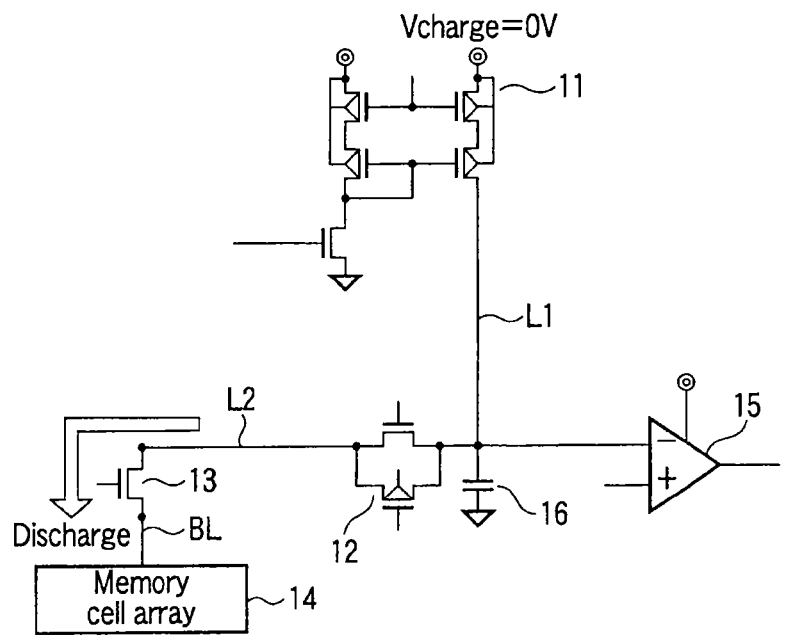
FIG. 2 is a circuit diagram showing a configuration of the voltage supply circuit which performs state conversion and a read operation for a memory cell in the resistance change memory.

FIGS. 1 and 2 show a voltage supply circuit used to supply a voltage to the memory cell when state conversion (set/reset) and a read operation for a memory cell are performed in the resistive random access memory.

In FIGS. 1 and 2, a current output from a current mirror circuit 11 is supplied to a bit line BL through a clamp transistor 12 and a selection transistor 13. The bit line BL is connected to a selected memory cell in a memory cell array 14, and a voltage supplied to the bit line BL is applied to the memory cell. The current mirror circuit 11 and the clamp transistor 12 are connected to each other by an interconnection L1, and a sense amplifier 15 and a capacitor 16 are connected to interconnection L1. Furthermore, the clamp transistor 12 and the selection transistor 13 are connected to each other by an interconnection L2.

In this case, measurement results of currents (read currents) obtained when voltages of two types, for example, a high voltage and a low voltage are supplied from the voltage supply circuit to memory cells in the circuit shown in FIG. 1, and a read operation is performed will be described below.

Figure 3:
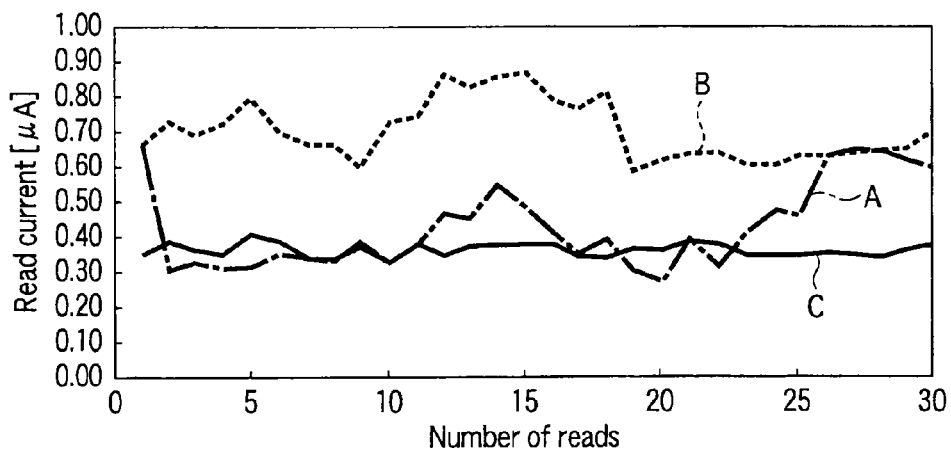
FIG. 3 is a graph showing a change of a read current depending on the number of reads in the resistance change memory.

FIG. 3 is a graph showing a change of a read current depending on the number of reads performed when a high voltage and a low voltage are applied.

In FIG. 3, a characteristic indicated by A is obtained by supplying a high voltage to a memory cell and measuring a read current. A characteristic indicated by B is obtained by supplying a low voltage to a memory cell and measuring a read current. In this manner, it is found that the read currents considerably vary at both the voltages.

Since the read current considerably varies as described above, it may be considered that a state change (resistance change) of a memory cell occurs at each measurement. As a cause of the state change, remaining electric charge on interconnections L1 and L2 or the like is applied to the memory cell when a selection transistor which selects a bit line is turned on.

Figure 4:
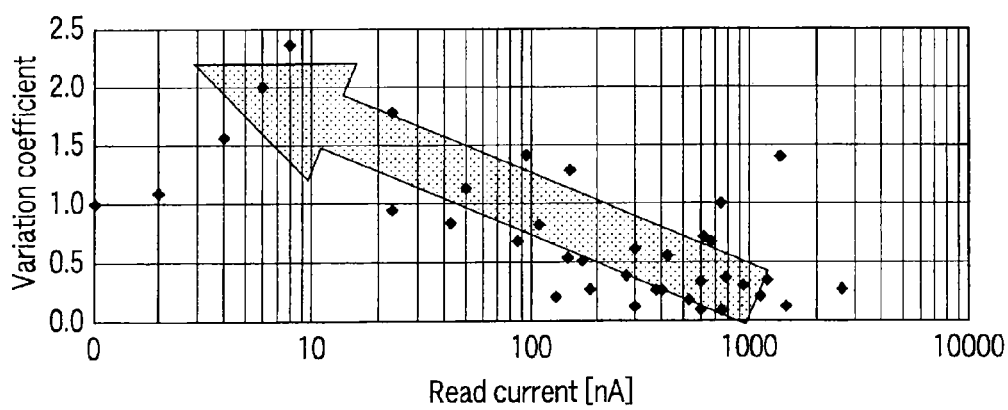
FIG. 4 is a graph showing a relationship between a read current and a variation coefficient in the voltage supply circuit.

FIG. 4 is a graph showing a relationship between a read current and a variation coefficient when a predetermined voltage is supplied from a voltage supply circuit to a memory cell to perform a read operation.

As is apparent from this graph, the variation coefficient is small when the read current is large, and the variation coefficient becomes large when the read current decreases. In the future, in a resistive random access memory, a read current may decrease. When the read current decreases, the variation coefficient increases, i.e., a variation in read current increases, and the reliability of the read operation may be deteriorated.

This will be described in detail with reference to FIGS. 1 and 2. In the resistive random access memory, when a read/memory cell state conversion operation is to be performed, a voltage is applied to a memory cell by the circuit shown in FIG. 1 through a bit line. At this time, even after the read/memory cell state conversion operation is ended, interconnections L1 and L2 shown in FIG. 1 may be still electrically charged.

In this case, when a next operation is performed while interconnections L1 and L2 are charged, as shown in FIG. 2, electric charge accumulated in interconnections L1 and L2 is discharged to the memory cell, and the state of the memory cell may be changed.

For this reason, as indicated by A and B in FIG. 3, it is considered that a read current considerably varies at each read operation. In this manner, when the read current considerably varies, a problem of considerable deterioration in reliability of the read operation is posed.

In the embodiment, to solve the above problem, a semiconductor memory device which prevents an unintended voltage/current from being applied to a memory cell and can reduce a variation in read current in a read operation is proposed. The embodiment will be described below with reference to the accompanying drawings. In the description, the same reference numerals in all the drawings denote the common parts in the drawings, respectively.

In general, according to one embodiment, a semiconductor memory device includes a memory cell, a power supply circuit, an interconnection and a discharging circuit. The memory cell includes a variable resistance element whose resistance varies by application of a voltage. The power supply circuit outputs the voltage to be applied to the memory cell. The interconnection is formed between the power supply circuit and the memory cell and supplies the voltage output from the power supply circuit to the memory cell. The discharging circuit is connected to the interconnection. The discharging circuit discharges electric charge accumulated in the interconnection after a first operation of applying the voltage to the memory cell is ended and before a second operation of applying the voltage to the memory cell next is started.

[1] Configuration of Resistive Random Access Memory of Embodiment

Figure 5:
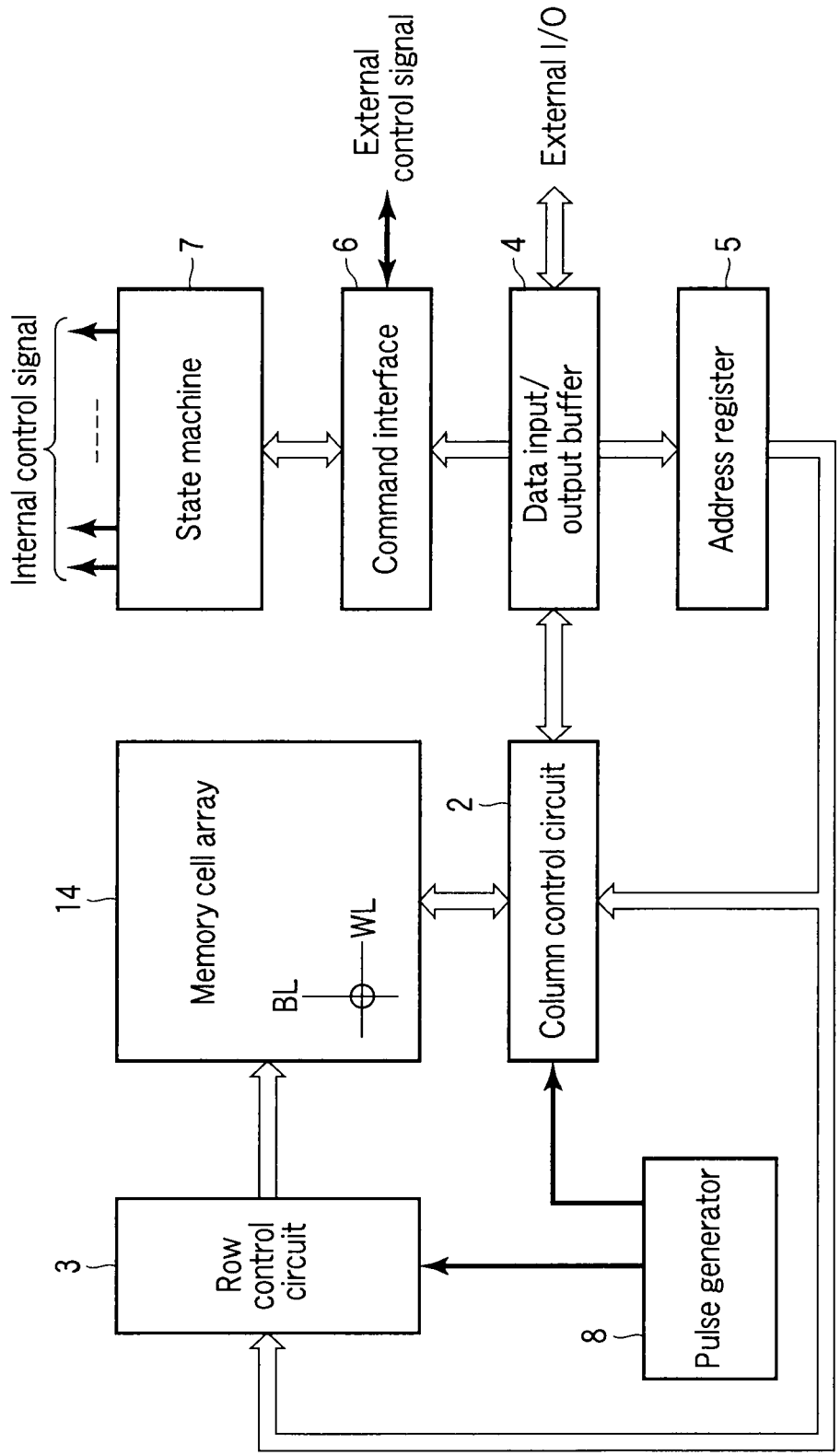
FIG. 5 is a block diagram showing a configuration of the resistance change memory according to an embodiment.

FIG. 5 is a block diagram showing a configuration of a resistive random access memory according to an embodiment.

The resistive random access memory comprises a memory cell array 14 in which memory cells are arranged in the form of a matrix. The memory cell comprises a variable resistance element (described later) and a rectifying element such as a diode.

A column control circuit 2 which controls bit lines BL of the memory cell array 14, sets/resets the memory cells, and reads data from the memory cells is arranged at a position adjacent to the memory cell array 14 in a bit line BL direction.

A row control circuit 3 which selects word lines WL of the memory cell array 14, sets/resets the memory cells, and applies a voltage necessary for data reading from the memory cells is arranged at a position adjacent to the memory cell array 14 in a word line WL direction.

A data input/output buffer 4 is connected to an external host apparatus (not shown) through an input/output (I/O) line, receives write data, outputs read data, and receives address data or command data. The data input/output buffer 4 sends the received write data to the column control circuit 2 and receives the data read from the column control circuit 2 to output the read data to the outside. An address supplied from the outside to the data input/output buffer 4 is sent to the column control circuit 2 and the row control circuit 3 through an address register 5.

A command supplied from the host apparatus to the data input/output buffer 4 is sent to a command interface 6. The command interface 6 determines whether the data input to the data input/output buffer 4 is write data, a command or an address in response to an external control signal from the host apparatus. When the data is the command, the command interface 6 receives the data and transfers the data to a state machine 7 as a command signal.

The state machine 7 is to manage the entire resistive random access memory. The state machine 7 accepts a command from the host apparatus and performs reading, setting, resetting, input/output management of data, and the like. The external host apparatus receives status information managed by the state machine 7 and can also determine an operation result. The status information is also used in write control.

An internal control signal is output from the state machine 7, and a pulse generator 8 or the like is controlled. With this control, the pulse generator 8 can output an arbitrary voltage and a pulse at an arbitrary timing. The formed pulse can be transferred to a bit line and a word line selected by the column control circuit 2 and the row control circuit 3.

Peripheral circuit elements other than the memory cell array 14 can be formed on a silicon substrate arranged immediately under the memory cell array 14 formed on an interconnection layer. In this manner, a chip area of the resistive random access memory can be made almost equal to the area of the memory cell array 14.

[1-1] Memory Cell Array

Figure 6:
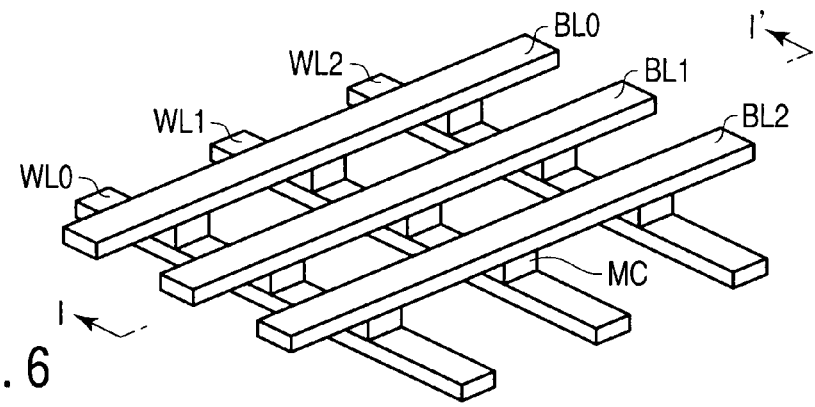
FIG. 6 is a perspective view of a part of a memory cell array in the embodiment.
Figure 7:
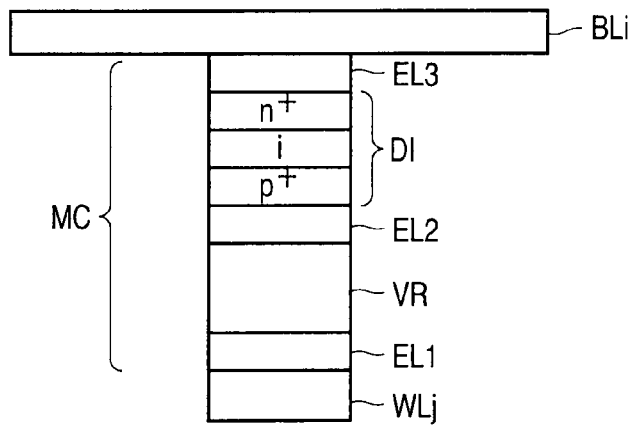
FIG. 7 is a sectional view of one memory cell cut along line I-I' in FIG. 6 as viewed from a direction of an arrow.

FIG. 6 is a perspective view of a part of the memory cell array 14 in the resistive random access memory, and FIG. 7 is a sectional view of one memory cell cut along line I-I' in FIG. 6 as viewed from a direction of an arrow. Note that reference symbols i and j in FIG. 7 denote 0, 1, 2, . . . .

As shown in FIG. 6, word lines WL0 to WL2 are arranged in parallel to each other as a plurality of first interconnections, and bit lines BL0 to BL2 are arranged in parallel to each other as a plurality of second interconnections such that the word lines WL0 to WL2 cross the bit lines BL0 to BL2. At crossing portions of the word lines WL0 to WL2 and the bit lines BL0 to BL2, memory cells MC are arranged to be sandwiched between both the interconnections. As materials of the first and second interconnections, materials which withstand heat and have low resistance are preferably used. For example, W, WSi, NiSi, CoSi, or the like is used.

[1-2] Memory Cell MC

As shown in FIG. 7, the memory cell MC is constituted by a circuit obtained by connecting a variable resistance element VR and a diode DI in series with each other. The variable resistance element VR has a resistance which can be changed through a current, heat, chemical energy, or the like. As the material of the variable resistance element VR, a complex compound containing cations serving as a transition element can be used.

On the upper and lower sides of the variable resistance element VR and the diode DT, electrodes EL1, EL2, and EL3 functioning as a barrier metal and an adhesive layer are arranged. The variable resistance element VR is arranged on the electrode EL1, and the electrode EL2 is arranged on the variable resistance element VR. The diode DI is arranged on the electrode EL2, and the electrode EL3 is arranged on the diode DI.

[1-3] Configuration of Voltage Supply Circuit (or Read Circuit)

The voltage supply circuit or the read circuit included in the column control circuit 2 according to the embodiment will be described below.

Figure 8:
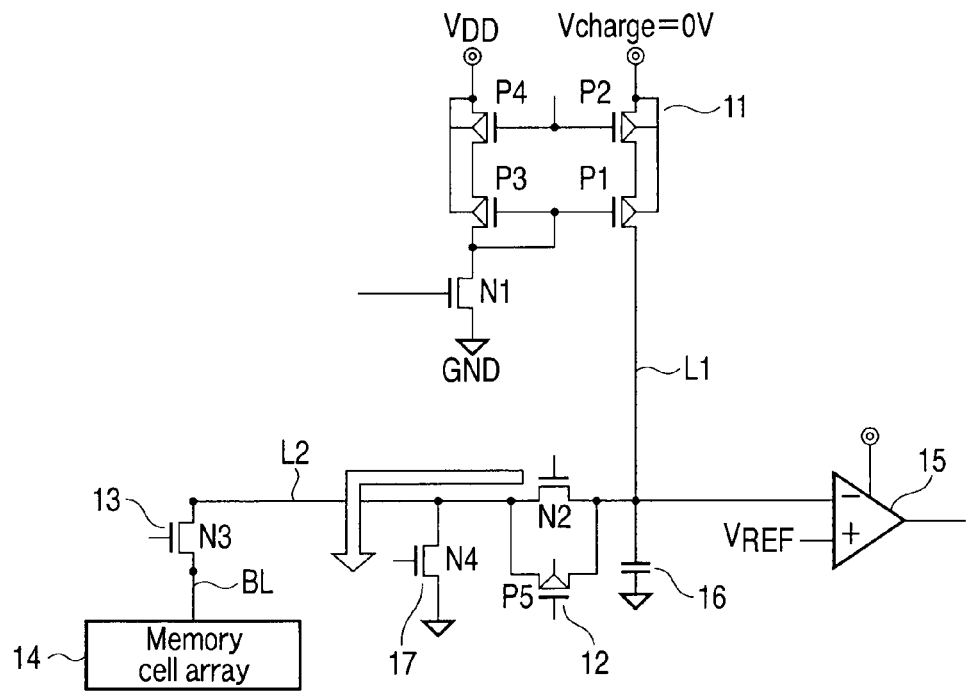
FIG. 8 is a circuit diagram showing a configuration of a voltage supply circuit in the embodiment.

FIG. 8 is a circuit diagram showing a main configuration of a voltage supply circuit in the embodiment.

The voltage supply circuit is a circuit which supplies a voltage to a selected memory cell to detect a read current in a read operation. Furthermore, the voltage supply circuit is a circuit which supplies a voltage to a selected memory cell in a memory cell state conversion operation, i.e., a set/reset operation.

As shown in FIG. 8, a current output from a power supply circuit, for example, the current mirror circuit 11 is supplied to a plurality of selection circuits, for example, the selection transistors 13 through the clamp transistor 12. In FIG. 8, only one selection transistor 13 is shown. The plurality of selection transistors 13 are connected to the plurality of bit lines BL, respectively. The plurality of bit lines BL are connected to the plurality of memory cells in the memory cell array 14. A voltage supplied to the bit line BL, selected by the selection transistor 13 from the plurality of bit lines, is supplied to a selected memory cell.

The current mirror circuit 11 and the clamp transistor 12 are connected to each other by interconnection L1. The sense amplifier 15 and the capacitor 16 are connected to interconnection L1. The clamp transistor 12 and the plurality of selection transistors 13 are connected to each other by interconnection L2. A discharging circuit 17 is connected to interconnection L2.

A configuration of the voltage supply circuit will be described below in detail.

The current mirror circuit 11 comprises p-channel MOS transistors P1 to P4 and an n-channel MOS transistor N1. A power supply VDD is connected to a source and a back gate of p-channel MOS transistor P2 and a back gate of p-channel MOS transistor P1. A drain of p-channel MOS transistor P2 is connected to a source of p-channel MOS transistor P1, and a drain of p-channel MOS transistor P1 is connected to interconnection L1. Furthermore, a gate of p-channel MOS transistor P2 is connected to a gate of p-channel MOS transistor P4.

The power supply VDD is connected to a source and a back gate of p-channel MOS transistor P4 and a back gate of p-channel MOS transistor P3. A drain of p-channel MOS transistor P4 is connected to a source of p-channel MOS transistor P3. The gate of p-channel MOS transistor P3 is connected to the gate of p-channel MOS transistor P1. The gate and the drain of p-channel MOS transistor P3 are connected to a drain of n-channel MOS transistor N1, and a source of n-channel MOS transistor N1 is connected to a reference voltage source, for example, a ground potential GND.

Interconnection L1 is connected to a negative input terminal of the sense amplifier 15, and a reference voltage VREF is supplied to a positive input terminal. Interconnection L1 is connected to a first electrode of the capacitor 16, and a reference voltage source, for example, the ground potential GND is connected to a second electrode of the capacitor 16. The sense amplifier 15 detects a state of a memory cell according to whether the voltage of interconnection L1 is higher than the reference voltage VREF in the read operation when a certain time has elapsed.

The clamp transistor 12 comprises an n-channel MOS transistor N2 and a p-channel MOS transistor P5. Sources and drains of n-channel MOS transistor N2 and p-channel MOS transistor P5 are connected in parallel to each other. Interconnection L1 is connected to the drain of n-channel MOS transistor N2 and the source of p-channel MOS transistor P5. Interconnection L2 is connected to the source of n-channel MOS transistor N2 and the drain of p-channel MOS transistor P5. The clamp transistor 12 controls a state between interconnection L1 and interconnection L2 to a connection state or a disconnection state and makes a voltage applied to interconnection L2 constant.

Each of the plurality of selection transistors 13 is constituted by an n-channel MOS transistor N3. Interconnection L2 is connected to a drain of n-channel MOS transistor N3, and the bit line BL is connected to a source of n-channel MOS transistor N3. In the read operation and the state conversion operation, the selection transistor 13 connected to the selected bit line BL is turned on, the other selection transistors 13 are turned off, and a voltage is supplied only to the selected bit line BL.

The discharging circuit 17 is constituted by an re-channel MOS transistor N4. Interconnection L2 is connected to a drain of n-channel MOS transistor N4, and a reference voltage supply, for example, the ground potential GND is connected to a source of n-channel MOS transistor N4. The discharging circuit 17 discharges a voltage of the selected bit line BL when the selection transistor 13 connected to the selected bit line is on. The discharging circuit 17 discharges voltages of interconnections L1 and L2 when the selection transistor 13 is off.

[2] Operation of Embodiment

[2-1] First Operation of Voltage Supply Circuit

FIGS. 9A and 9B are timing charts showing a discharging operation (first example) of the voltage supply circuit in the embodiment. FIG. 9A is a timing chart in a read operation, and FIG. 9B is a timing chart in a set/reset operation.

As shown in FIG. 9A, at time T1, a read voltage is applied to a selected memory sell to start the read operation. At time T2, discharging of the voltage applied to the selected memory cell is started, and the read operation is ended. More specifically, a selected word line (Selected WL), an unselected word line (Unselected WL), and a selected bit line (Selected BL)

are set to the read voltage. Thereafter, the voltage of the selected word line is discharged at time T1 and becomes 0 V, whereby a read operation is started. At time T2, discharging of the selected bit line is started, and the read operation is ended. During the read operation, the unselected bit line (Unselected BL) is set to 0 V.

Interconnections L1 and L2 (charged lines) are set to a high voltage when the voltage of the selected bit line is boosted to a read voltage. When the read operation is started, the voltage drops according to a state (resistance) of a memory cell. Furthermore, when the voltage of the selected bit line is discharged upon completion of the read operation, interconnections L1 and L2 are discharged. The discharging at this time is an ordinary operation. In a state in which the selection transistor 13 is on, the operation is executed by turning the transistor N4 of the discharging circuit 17 on.

Thereafter, by the time the next read operation is started, a discharging operation by the discharging circuit 17 is executed in a state in which the selection transistor 13 is off. More specifically, by the time a next read operation is started after the previous read operation is ended, the selection transistor 13 is turned off. When the bit line BL and interconnection L2 are disconnected from each other, for example, at time T3, a high pulse is applied to the discharging circuit 17 as a discharge pulse. In this manner, electric charge accumulated in interconnections L1 and L2 is discharged by the discharging circuit 17, and the voltages of interconnections L1 and L2 are sufficiently discharged.

A read current obtained according to the operation shown in FIG. 9A, i.e., a read current obtained when the read operation is repeated while discharging the electric charge of interconnections L1 and L2 until a next read operation is started after the previous read operation is indicated by C in FIG. 3. As is apparent from C in FIG. 3, when a read operation is performed according to the operation shown in FIG. 9A, a variation in read current can be reduced.

A set/reset operation will be described below.

As shown in FIG. 9B, in the set/reset operation, at time T11, a predetermined voltage is applied to a selected memory cell to start a set operation or a reset operation. At time T12, discharging of the voltage applied to the selected memory cell is started, and the set operation or the reset operation is ended. More specifically, a selected word line (Selected WL), an unselected word line (Unselected WL), and a selected bit line (Selected BL) are set to a predetermined voltage. Thereafter, at time T11, a voltage of the selected word line is discharged to be 0 V, whereby the set operation or the reset operation is started. At time T12, discharging of the selected bit line is started, and the set operation or the reset operation is ended. The unselected bit line (Unselected BL) is set to 0 V during the set operation or the reset operation.

Interconnections L1 and L2 (charged lines) are set to a high voltage when the voltage of the selected bit line is boosted to a predetermined voltage. When the set operation or the reset operation is started, the voltages of interconnections L1 and L2 drop according to a state (resistance) of the memory cell. Furthermore, when the voltage of the selected bit line is discharged upon completion of the set operation or the reset operation, interconnections L1 and L2 are discharged. The discharging performed at this time is an ordinary operation. In a state in which the selection transistor 13 is on, the operation is executed by turning the transistor N4 of the discharging circuit 17 on.

Thereafter, by the time a next set operation or a next reset operation is started, the discharging operation by the discharging circuit 17 is executed in a state in which the selection transistor 13 is off. More specifically, the selection transistor 13 is turned off by the time a next set operation or a next reset operation is started after the previous set operation or the previous reset operation is ended. When the bit line BL and interconnection L2 are disconnected from each other, for example, at time T13, a high pulse is applied to the discharging circuit 17 as a discharge pulse. In this manner, electric charge accumulated in interconnections L1 and L2 is discharged by the discharging circuit 17, and the voltages of interconnections L1 and L2 are sufficiently discharged.

When the set operation or the reset operation is performed while discharging the electric charge of interconnections L1 and L2 according to the operation shown in FIG. 9B, i.e., by the time a next set operation or a next reset operation is started after the previous set operation or the previous reset operation is ended, the state of the memory cell can be prevented from being disadvantageously changed to an unintended state (resistance).

The first operation shows the example in which a read voltage or a predetermined voltage is applied to a selected word line, an unselected word line, and a selected bit line in advance, and thereafter, the voltage of the selected word line is set to 0 V. However, the word line and the bit line may be reversed. More specifically, a read voltage or a predetermined voltage may be applied to the selected bit line, the unselected bit line, and the selected word line in advance to set the voltage of the selected bit line to 0 V so as to apply a voltage to the selected memory cell.

In this first operation, by the time a next operation (reading or setting or resetting) is started after the previous operation (reading or setting or resetting), in a state in which the selection transistor 13 which connects the bit line BL and the voltage supply circuit (or read circuit) is turned off, electric charge accumulated in interconnections L1 and L2 in the voltage supply circuit is discharged. In this manner, when a next operation is executed, or when a power supply is turned on/off, electric charge accumulated in interconnections L1 and L2 can be prevented from being discharged to the memory cell. As a result, an unintended state change, i.e., an unintended resistance change can be prevented from occurring in the memory cell, and the reliability of the memory cell can be improved.

[2-2] Second Operation of Voltage Supply Circuit

FIGS. 10A and 10B are timing charts showing a discharging operation (second example) of a voltage supply circuit in the embodiment. FIG. 10A is a timing chart in a read operation, and FIG. 10B is a timing chart in a set/reset operation.

As shown in FIG. 10A, immediately before the read operation is started, a discharging operation by the discharging circuit 17 is executed in a state in which the selection transistor 13 is off. More specifically, immediately before a read operation is started at time T1, the selection transistor 13 is turned off at time T0, and a high pulse is applied to the discharging circuit 17 as a discharge pulse in a state in which the bit line BL and interconnection L2 are disconnected from each other. In this manner, electric charge accumulated in interconnections L1 and L2 is discharged by the discharging circuit 17, and the voltages of interconnections L1 and L2 can be sufficiently discharged.

Immediately after the discharging operation, a read voltage is applied to a selected memory cell at time T1, and a read operation is started. At time T2, discharging of a voltage applied to the selected memory cell is started, and the read operation is ended. An unselected bit line is set to 0 V during the read operation.

Interconnections L1 and L2 (charged lines) are set to a high voltage when the voltage of the selected bit line is boosted to a read voltage. When the read operation is started, the voltages of interconnections L1 and L2 drop according to a state (resistance) of the memory cell. Furthermore, when the voltage of the selected bit line is discharged upon completion of the read operation, interconnections L1 and L2 are discharged. The discharging performed at this time is an ordinary operation. In a state in which the selection transistor 13 is on, the operation is executed by turning the transistor N4 of the discharging circuit 17 on.

According to the operation shown in FIG. 10A, i.e., immediately before the read operation is started, the electric charge of interconnections L1 and L2 is discharged. Thereafter, when the read operation is performed, a variation in read current can be reduced.

The set/reset operation will be described below.

As shown in FIG. 10B, immediately before the set operation or the reset operation is started, a discharging operation by the discharging circuit 17 is executed in a state in which the selection transistor 13 is off. More specifically, immediately before the set operation or the reset operation is started at time T11, the selection transistor 13 is turned off at time T10, and a high pulse is applied to the discharging circuit 17 as a discharge pulse in a state in which the bit line BL and interconnection L2 are disconnected from each other. In this manner, electric charge accumulated in interconnections L1 and L2 is discharged by the discharging circuit 17, and the voltages of interconnections L1 and L2 can be sufficiently discharged.

Immediately after the discharging operation, a predetermined voltage is applied to a selected memory cell at time T11, and a set operation or a reset operation is started. At time T12, discharging of a voltage applied to the selected memory cell is started, and the set operation or the reset operation is ended. An unselected bit line is set to 0 V during the set operation or the reset operation.

Interconnections L1 and L2 (charged lines) are set to a high voltage when the voltage of the selected bit line is boosted to a predetermined voltage. When the set operation the read operation is started, the voltages of interconnections L1 and L2 drop according to a state (resistance) of the memory cell. Furthermore, when the voltage of the selected bit line is discharged upon completion of the set operation or the reset operation, interconnections L1 and L2 are discharged. The discharging performed at this time is an ordinary operation. In a state in which the selection transistor 13 is on, the operation is executed by turning the transistor N4 of the discharging circuit 17 on.

According to the operation shown in FIG. 10B, i.e., immediately before the set operation or the reset operation is started, the electric charge of interconnections L1 and L2 is discharged. Thereafter, when the reset operation or the reset operation is performed, the memory cell can be prevented from being disadvantageously changed into an unintended state (resistance).

Even in the second operation, a read voltage or a predetermined voltage is applied to a selected word line, an unselected word line, and a selected bit line. Thereafter, the voltage of the selected word line is set to 0 V to apply a voltage to a selected memory cell. The word line and the bit line may be reversed. More specifically, a read voltage or a predetermined voltage may be applied to the selected bit line, the unselected bit line, and the selected word line in advance to set the voltage of the selected bit line to 0 V so as to apply a voltage to the selected memory cell.

In the second operation, immediately before a next operation (reading or setting or resetting) is started, in a state in which the selection transistor 13 which connects the bit line BL and the voltage supply circuit (or read circuit) is turned off, electric charge accumulated in interconnections L1 and L2 in the voltage supply circuit is discharged. In this manner, when a next operation is executed, or when a power supply is turned on/off, electric charge accumulated in interconnections L1 and L2 can be prevented from being discharged to the memory cell. As a result, an unintended state change, i.e., an unintended resistance change can be prevented from occurring in the memory cell, and the reliability of the memory cell can be improved.

According to the embodiment, a semiconductor memory device which can prevent an unintended voltage/current from being applied to a memory cell can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory cell comprising a variable resistance element whose resistance varies by application of a voltage;
    a power supply circuit which outputs the voltage to be applied to the memory cell;
    an interconnection which is formed between the power supply circuit and the memory cell and supplies the voltage output from the power supply circuit to the memory cell;
    wherein the interconnection further comprises at least a first segment between a selection circuit and the power supply;
    a discharging circuit connected to the interconnection;
    a sense amplifier which detects information stored in the memory cell according to the voltage of the interconnection; and
    the selection circuit which switches a state between the interconnection, the sense amplifier, and the memory cell to one of a connection state and a disconnection state,
    wherein, in a first discharge operation, the discharging circuit discharges electric charge accumulated in the interconnection after a first operation of applying the voltage to the memory cell is ended and, in a second discharge operation, before a second operation of applying the voltage to the memory cell next is started,
    wherein the discharging circuit discharges electric charge accumulated in the interconnection when the selection circuit sets the connection state, and then the discharging circuit discharges the electric charge accumulated in the first segment when the selection circuit sets the disconnection state.

2. The semiconductor memory device according to claim 1, wherein the discharging circuit discharges the electric charge accumulated in the interconnection immediately before the second operation is started.

3. The semiconductor memory device according to claim 1, wherein the first operation and the second operation include any one operation of reading, setting, and resetting, and the setting operation changes the variable resistance element from a high-resistance state to a low-resistance state, and the resetting operation changes the variable resistance element from the low-resistance state to the high-resistance state.

4. The semiconductor memory device according to claim 1, wherein the memory cell is arranged between a bit line and a word line, such that the memory cell is electrically connected to the bit line and the word line, and
the selection circuit switches a state between the bit line or the word line and the interconnection to one of the connection state and the disconnection state.

5. The semiconductor memory device according to claim 1, wherein the memory cell comprises a rectifying element connected to the variable resistance element.

6. The semiconductor memory device according to claim 5, wherein the rectifying element includes a diode.

7. A semiconductor device comprising:
a memory cell comprising a variable resistance element whose resistance varies by application of a voltage;
a first interconnection connected to the memory cell;
a power supply circuit which outputs the voltage to be applied to the memory cell;
a second interconnection which is connected to the power supply circuit and to which the voltage is supplied from the power supply circuit;
a selection circuit which is connected between the first interconnection and the second interconnection and switches a state between the first interconnection and the second interconnection to one of a connection state and a disconnection state; and
a discharging circuit connected to the second interconnection,
wherein, in a first discharge operation, the discharging circuit discharges electric charge accumulated in the second interconnection after a first operation of applying the voltage to the memory cell is ended and,
in a second discharge operation, before a second operation of applying the voltage to the memory cell next is started, the discharging circuit discharges the electric charge accumulated in the first and the second interconnections when the selection circuit sets the connection state,
and then the discharging circuit discharges the electric charge accumulated in the second interconnection when the selection circuit sets the disconnection state.

8. The semiconductor memory device according to claim 7, wherein the discharging circuit discharges the electric charge accumulated in the second interconnection immediately before the second operation is started.

9. The semiconductor memory device according to claim 7, further comprising:
a sense amplifier which detects information stored in the memory cell according to a voltage of the second interconnection.

10. The semiconductor memory device according to claim 7,
wherein the first operation and the second operation include any one operation of reading, setting, and resetting, and the setting operation changes the variable resistance element from a high-resistance state to a low-resistance state, and the resetting operation changes the variable resistance element from the low-resistance state to the high-resistance state.

11. The semiconductor memory device according to claim 7,
wherein the first interconnection includes one of a bit line and a word line.

12. The semiconductor memory device according to claim 11,
wherein the memory cell is arranged between the bit line and the word line, such that the memory cell is electrically connected to the bit line and the word line, and
the selection circuit switches a state between the bit line or the word line and the second interconnection to one of the connection state and the disconnection state.

13. The semiconductor memory device according to claim 7,
wherein the memory cell comprises a rectifying element connected to the variable resistance element.

14. The semiconductor memory device according to claim 13,
wherein the rectifying element includes a diode.

* * * * *